United States Patent [19]
Arnell

[11] 3,728,556
[45] Apr. 17, 1973

[54] REGENERATIVE FET CONVERTER CIRCUITRY

[75] Inventor: Clifford G. Arnell, Warminster, Pa.

[73] Assignee: United Aircraft Corporation, East Hartford, Conn.

[22] Filed: Nov. 24, 1971

[21] Appl. No.: 201,678

[52] U.S. Cl. ....................................307/251, 307/304
[51] Int. Cl. ............................................H03k 17/60
[58] Field of Search ..................307/205, 214, 221 C, 307/230, 251, 279, 304

[56] References Cited

UNITED STATES PATENTS

| | | | |
|---|---|---|---|
| 3,389,383 | 6/1968 | Burke et al. | 307/279 X |
| 3,238,310 | 3/1966 | Wells | 307/230 X |
| 3,191,061 | 6/1965 | Weimer | 307/221 C |
| 3,406,346 | 10/1968 | Wanlass | 307/304 X |
| 3,427,445 | 2/1909 | Dailey | 307/205 X |
| 3,448,293 | 6/1969 | Russell | 307/251 |
| 3,453,507 | 7/1969 | Archer | 307/304 X |
| 3,553,541 | 1/1971 | King | 307/304 X |
| 3,618,053 | 11/1971 | Hudson | 307/279 X |

*Primary Examiner*—John W. Huckert
*Assistant Examiner*—R. E. Hart
*Attorney*—Melvin Pearson William

[57] ABSTRACT

A converter receiving low voltage signals, such as from bipolar transistor circuits and applying corresponding signals to higher voltage circuits, such as MOS transistor circuits, comprises a MOS inverter having regenerative feedback which drives the inverter with a greater voltage than that supplied thereto by the bipolar circuits. This results in positive switching which reduces switching time, avoids race conditions, and eliminates switching ambiguities which result from high noise/signal line conditions. In one embodiment, regeneration provides latching in either of two stable states.

6 Claims, 4 Drawing Figures

REGENERATIVE FET CONVERTER CIRCUITRY

BACKGROUND OF THE INVENTION

1. Field of Invention

This invention relates to transistor switching circuitry, and more particularly to improvements in insulated gate field effect transistor converter circuitry from bipolar transistor circuitry.

2. Description of the Prior Art

Digital electronic circuits are frequently implemented with insulated gate field effect transistors, (IGFETs) and typically with metal oxide silicon (MOS) types of IGFETs. The MOS technology is relatively inexpensive and is well suited to large orthogonal arrays, and has therefore been widely employed in the manufacture of storage arrays, shift registers and coding matrices. However, MOS transistors are not capable of operating at speeds as great as those which may be achieved with bipolar transistors. For this and other reasons, certain of the logic circuitry utilized to drive MOS circuits is frequently implemented in bipolar transistor technology. Similarly, the signal outputs of MOS arrays are frequently applied to bipolar transistor circuits. Because bipolar transistors are switched with smaller voltage excursions than that required for MOS circuits, it is relatively simple to drive bipolar circuits with the MOS circuits, but the converse is not true. Because the speed of switching of MOS circuits is highly dependent upon the voltage of the driving signals, utilization of relatively lower voltage signals from bipolar devices to drive the MOS devices results in switching ambiguities, lower switching speeds, and race conditions in establishing steady-state operation of MOS arrays. This becomes even more complex when the variations in tolerances between various circuits can cause different driving response in different parts of the same MOS array as a result of a given input signal. There are also other environments (other than bipolar) where low voltage signals are used to drive MOS devices.

SUMMARY OF THE INVENTION

The object of the present invention is to provide insulated gate field effect transistor circuits with improved response to small input signals.

According to the present invention, an insulated gate field effect transistor circuit driven with small signals includes regenerative feedback means, whereby a small input signal which commences to drive the conversion means causes an additional voltage input to fully and rapidly drive the conversion means. One embodiment is a regenerative converter amplifier; another embodiment is a bistable device.

The present invention eliminates race conditions, indeterminate switching speeds, and other conditions attendant insulated gate field effect transistors which result from inadequate voltage of the driving signal.

Other objects, features and advantages of the present invention will become more apparent in the light of the following detailed description of a preferred embodiment thereof, as illustrated in the accompanying drawing.

DESCRIPTION OF THE PREFERRED EMBODIMENT

Figure 1:
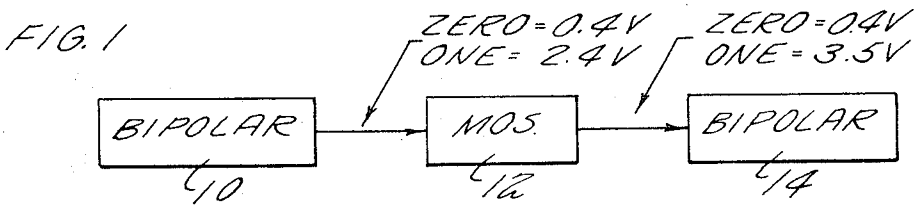
FIG. 1 is a simplified block diagram of prior art circuitry to which the present invention relates.
Figure 2:
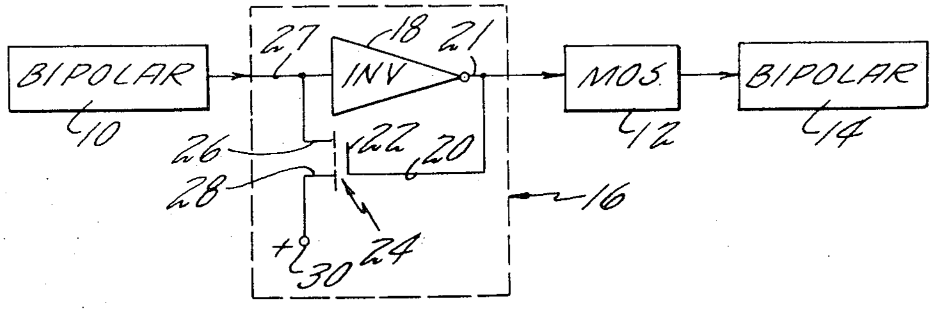
FIG. 2 is a simplified schematic block diagram illustrating the relationship of the invention to the prior art circuitry.

Referring now to FIG. 1, a common relationship between bipolar and MOS transistors of the type described hereinbefore includes bipolar circuits 10 driving MOS circuits 12 which in turn drive further bipolar circuits 14. In FIG. 2, a regenerative converter 16 in accordance with the present invention is shown receiving signals from the bipolar circuits 10 and driving the MOS circuits 12. The converter 16 comprises essentially an inverting amplifier 18 with a feedback connection 20 from its output 21 to the gate 22 of an insulated gate field effect transistor 24 having its drain 26 connected to the input 27 of the inverter and its source 28 connected to a suitable potential, which in one embodiment is a positive potential as described more fully hereinafter. Thus, any signal tending to operate the inverter 18 will cause the inverter output to operate the IGFET 24, thereby driving the inverter with full voltage supplied from the source 30.

Figure 3:
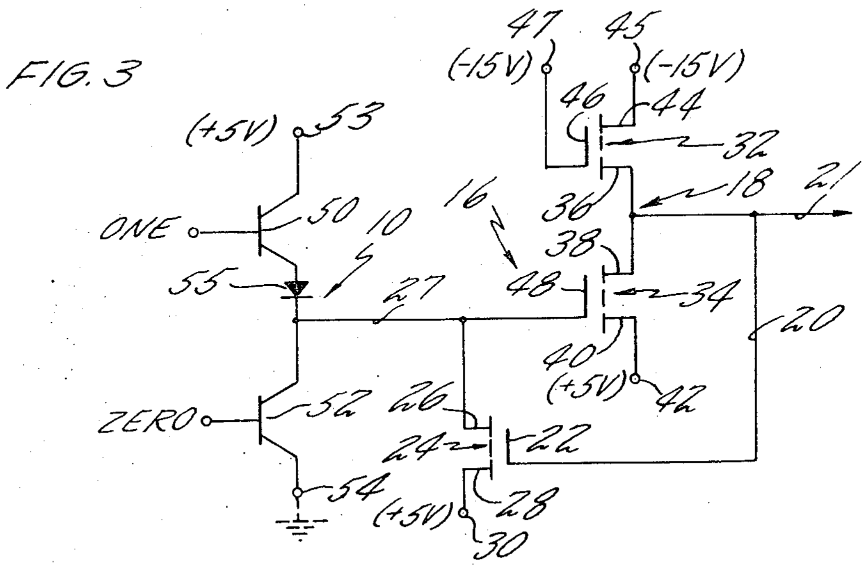
FIG. 3 is a simplified schematic diagram of one embodiment of the present invention.

This is shown in detail in FIG. 3 wherein the inverter is seen to comprise a pair of IGFETs 32, 34 with the source 36 of the IGFET 32 connected to the drain 38 of the IGFET 34, and the source 40 of the IGFET 34 connected to a suitable supply 42 of positive voltage, which may typically be plus 5 volts. The drain 44 of the IGFET 32 is connected to a supply 45 of a suitable potential, such as minus fifteen volts, and the gate 46 is similarly connected to a suitable voltage supply 47, such as minus 15 volts. The gate 48 of the IGFET 34 is connected to the input line 27 of the inverter 16. Input 27 is connected between a pair of bipolar transistors 50, 52. These transistors are connected in series between a supply 53 of plus 5 volts and a supply 54 of essentially zero volts, or ground, with a diode 55 therebetween.

As contemplated herein the IGFETs 24, 32, 34 are all P-channel depletion mode MOS IGFETs, and therefore are rendered conductive by negative signals applied to the gates and are rendered nonconductive by positive signals applied to the gates. The IGFET 32, having its gate connected to a negative potential 47, is conducting at all times, and thereby applies about minus 11 volts (the voltage of the source 45 minus the voltage drop across the IGFET). Assume the initial condition is with the transistor 52 conducting, and the transistor 50 off, the potential on the line 27 will be approximately 0.4 volts. This causes the IGFET 34 conducting, and in this condition, the plus 5 volts 42 connected to its source 40 and the minus 15 volts 45 connected to the drain 44 of the IGFET 32, through voltage division, cause the output line 21 to be approximately plus 4 volts, turning off the IGFET 24. However, when changing from binary zero to binary one, the signal conditions at the inputs to the transistors 50, 52 will reverse so that the transistor 50 will commence conduction whereas the transistor 52 will be turned off. This being so, the voltage division and diode drops between the plus 5 volts and ground is such that there is a tendency for the line 27 to adjust towards approximately 2.4 volts. This positive potential applied to the gate 48 will cause the IGFET 34 to tend to turn off, while the IGFET 32 remains conducting. This alters the division of voltage between the minus 15 volt and plus five volt sources, so that the output line 21 tends to approach minus 11 volts. As this voltage begins to swing negative, it is applied by the feedback line 20 to the gate 22 of the IGFET 24 causing the IGFET 24 to commence conduction. With the IGFET 24 conducting, nearly five volts is applied from the source 30 directly to the input line 27, and this positive voltage drives the IGFET 34 into complete cut off very rapidly. Thus, the feedback is regenerative and operates in a sort of a toggle fashion.

Of course the bipolar circuitry 50, 52, 55 is merely an example of a small signal source with which the invention is advantageously utilized. Additionally, although the embodiment of FIG. 3 is described with respect to P-channel enhancement mode IGFETs, it should be understood that other types of devices may readily be employed in a configuration utilizing the present invention.

Figure 4:
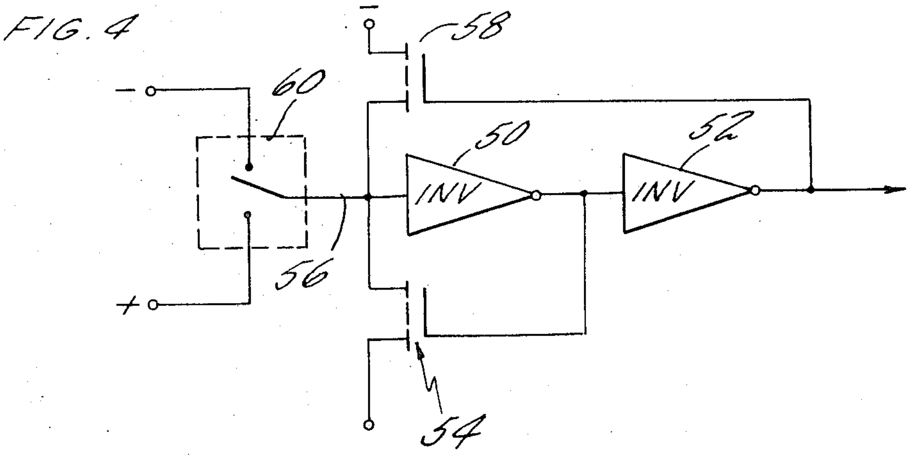
FIG. 4 is a simplified schematic block diagram of a second embodiment of the invention.

Another embodiment of the invention as illustrated in FIG. 4 wherein a pair of inverters 50, 52 are serially connected, with one IGFET 54 regeneratively connected to an input 56 of the inverter 50 and another IGFET 58 regeneratively connected from the output of the inverter 52 to the input 56 of the inverter 50. The input 56 is connected to a switch means 60 which may comprise any suitable sort of switch in any given embodiment of the present invention, and which serves to apply either a positive or a negative voltage, respectively, to the input 56. In the embodiment of FIG. 4, bipolar regenerative conversion action is achieved since regardless of the polarity of the input signal 56, one or the other of the IGFETs 54, 58 will regeneratively drive the inverter 50 into either a highly conducting condition or a relatively nonconducting condition, in a fast, regenerative fashion, which is similar to that described with respect to FIG. 3 hereinbefore. Thus, if the switch is moved to cause a negative signal to be applied to the input 56, this will cause the inverter 50 to have a positive output which does not turn on the IGFET 54, but it does cause the inverter 52 to have a negative output which turns on the IGFET 58, thereby connecting the negative potential to the input 56 to regeneratively drive the inverter 50 further into the conducting condition. On the other hand, if a positive voltage is applied to the input 56, the inverter 50 tends to be turned off, so that the inverter 52 tends to be turned on. The output of the inverter 50 being negative causes high conduction condition at the IGFET 54 which drives the input 56 even further in the positive direction in a regenerative fashion. It is to be noted that a circuit in accordance with the embodiment of FIG. 4 is unconditionally stable without regard to the position of the switch 60, since once it assumes a given polarity of operation, either the IGFET 54 or the IGFET 58 will be highly conductive and its related connection to one of the inverters 50, 52, respectively, will cause it to remain so until the polarity of the switch is reversed. Thus either condition of operation may be established by closing the switch 60 in either direction so as to apply a positive or a negative signal thereto, and then the switch may be opened and the circuit will remain latched in that condition until it has been broken therefrom by the switch being moved to the opposite position. The positive and negative voltages are merely voltages relatively opposite to one another with respect to the reference potential of operation of the device (which may be ground or other suitable potential).

Thus the present invention comprises not only a regenerative switch, but a regenerative converter which responds very rapidly to small signals to generate much larger signals. The invention may be implemented for either positive or negative switching action, or both, and may be embodied in the form utilizing its full potential for flip-flop type, self-latching action.

Although the invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. A regenerative converter adapted to receive signals which are of a given maximum magnitude and rapidly generate related signals of a higher magnitude, comprising:

a first transistor switching stage having an input and an output, said first transistor switching stage being responsive to a voltage of a first polarity and said given magnitude at its input to cause its output to assume a voltage of a second polarity and a second magnitude higher than said given magnitude;

a source of a potential of said first polarity and of a magnitude substantially higher than said given magnitude; and a second transistor switching stage having an input and a pair of main current-carrying electrodes, said second transistor switching stage being responsive to a voltage of said second polarity and said second magnitude at its input to assume a highly conductive condition between said electrodes, said second transistor switching stage having its input connected to the output of said first transistor switching stage, one of said electrodes connected to the input of said first transistor switching stage, and the other of said electrodes connected to said source, whereby an input signal to said first transistor stage of said first polarity and given magnitude causes an input of said second polarity and second magnitude to said second transistor switching stage, thereby connecting the potential of said first polarity and substantially higher magnitude to said input of said first transistor switching stage to regeneratively assist in the operation thereof.

2. A regenerative converter according to claim 1 wherein said second transistor switching stage comprises an IGFET having a gate comprising said input thereof, and having a source and a drain comprising said electrodes thereof.

3. A regenerative converter according to claim 1 wherein said first transistor switching stage comprises at least a first IGFET having a gate comprising said input thereof and having its source connected to a potential of said first polarity and said first magnitude and its drain connected to a potential supply of said second polarity and of a magnitude at least as great as said second magnitude, said drain comprising said output thereof.

4. A regenerative converter according to claim 3 wherein said second transistor switching stage comprises a second IGFET of the same channel conductivity type as said first IGFET, said second IGFET being continuously biased to conduct and connecting said drain of said first IGFET to said potential source.

5. A regenerative converter according to claim 4 wherein said second transistor switching stage comprises an IGFET having a gate comprising said input thereof, and having a source and a drain comprising said electrodes thereof.

6. A latching regenerative converter comprising:

a pair of inverting amplifiers connected in series, the output of a first one of said amplifiers being connected to the input of the second one of said amplifiers, each of said amplifiers operative in response to a first potential to provide an output signal of a second potential;

a source of said first potential and a source of said second potential;

a first field effect transistor having its gate connected to the output of said first amplifier inverter and having its source and drain connected between said first potential source and the input of said first amplifier; and a second field effect transistor having its gates connected to the output of said second amplifier and its source and drain connected between said second potential source and the input of said first amplifier.

* * * * *